United States Patent
Kataoka et al.

(10) Patent No.: US 10,705,154 B2
(45) Date of Patent: Jul. 7, 2020

(54) VOLTAGE DETECTION STRUCTURE AND VOLTAGE DETECTION MODULE

(71) Applicant: Yazaki Corporation, Tokyo (JP)

(72) Inventors: Ryota Kataoka, Shizuoka (JP); Shinichi Yanagihara, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 195 days.

(21) Appl. No.: 15/826,544

(22) Filed: Nov. 29, 2017

(65) Prior Publication Data

US 2018/0164382 A1   Jun. 14, 2018

(30) Foreign Application Priority Data

Dec. 9, 2016   (JP) .................................. 2016-239797

(51) Int. Cl.
| | | |
|---|---|---|
| *G01R 31/396* | (2019.01) | |
| *G01R 31/3832* | (2019.01) | |
| *G05B 1/00* | (2006.01) | |
| *H01M 2/00* | (2006.01) | |

(52) U.S. Cl.
CPC ........ *G01R 31/396* (2019.01); *G01R 31/3833* (2019.01)

(58) Field of Classification Search
CPC ....... G05B 1/00; G05B 2219/00; H01M 2/00; H01M 2200/00
See application file for complete search history.

(56) References Cited

U.S. PATENT DOCUMENTS

| 6,111,387 A | 8/2000 | Kouzu et al. |
| 2008/0185276 A1* | 8/2008 | Matsunaga ...... H01R 13/62938 200/335 |
| 2008/0314657 A1* | 12/2008 | Ikeda .................. H01M 2/1077 180/65.1 |
| 2008/0315815 A1* | 12/2008 | Serizawa ............ H02P 29/0241 318/453 |

(Continued)

FOREIGN PATENT DOCUMENTS

| JP | 10-270006 A | 10/1998 |
| JP | 2007-225577 A | 9/2007 |

(Continued)

OTHER PUBLICATIONS

Japanese Office Action for the related Japanese Patent Application No. 2016-239797 dated Feb. 26, 2019.

*Primary Examiner* — Jermele M Hollington
*Assistant Examiner* — Temilade S Rhodes-Vivour
(74) *Attorney, Agent, or Firm* — Kenealy Vaidya LLP

(57) ABSTRACT

A connection conductor and a relay terminal are electrically connected together directly, the connection conductor being electrically connected to one of the two opposite electrode terminals of a battery cell, the relay terminal being provided to an extremity of a voltage detection conductor electrically connected to a voltage detector. The relay terminal has a fusible part operable to fuse and break when an overcurrent flows through the fusible part, wherein a sectional area of the fusible part perpendicular to a direction in which the voltage detection conductor extends is smaller than a sectional area of any other part of the relay terminal perpendicular to the direction.

5 Claims, 3 Drawing Sheets

(56) References Cited

U.S. PATENT DOCUMENTS

| | | | | |
|---|---|---|---|---|
| 2011/0024205 A1* | 2/2011 | Nishihara | ............. | H01M 10/48 180/65.1 |
| 2011/0244283 A1* | 10/2011 | Seto | ................... | H01M 2/1077 429/91 |
| 2011/0248719 A1* | 10/2011 | Aoki | ................... | H01M 10/482 324/426 |

FOREIGN PATENT DOCUMENTS

| | | |
|---|---|---|
| JP | 2013-196932 A | 9/2013 |
| JP | 2015-207393 A | 11/2015 |

* cited by examiner

VOLTAGE DETECTION STRUCTURE AND VOLTAGE DETECTION MODULE

CROSS-REFERENCE TO RELATED APPLICATION(S)

The present application claims priority to and incorporates by reference the entire contents of Japanese Patent Application No. 2016-239797 filed in Japan on Dec. 9, 2016.

BACKGROUND OF THE INVENTION

1. Field of the Invention

The present invention relates to a voltage detection structure and a voltage detection module.

2. Description of the Related Art

Conventionally, a battery pack composed of a plurality of battery cells and a monitoring unit electrically connected to the battery cells via a busbar module is installed in an electric vehicle or hybrid vehicle, the battery cells functioning as a battery to store electric power therein, the monitoring unit being configured to monitor the respective power storage states of the battery cells. The battery cells are continuously arranged with electrode terminals on one side thereof arranged in a row and with electrode terminals on the other side thereof arranged in a row. Electrode terminals of each adjacent two of the battery cells are electrically connected together by a busbar of the busbar module, and one end portion of a voltage detection cable of the busbar module is electrically connected to each of the busbars. The monitoring unit monitors the power storage states of the battery cells based on respective voltages from the battery cells. The monitoring unit therefore includes voltage detectors that detect respective voltages from the battery cells. The other end portion of the voltage detection cable is electrically connected to one of the voltage detectors. These configurations enable the voltage detectors to detect respective voltages from the battery cells and enable the monitoring unit to monitor the power storage states of the battery cells.

That is, the above battery pack has the busbars and the voltage detection conductors in the busbar module constituting a voltage detection structure for enabling the voltage detectors to detect respective voltages from the battery cells (Japanese Patent Application Laid-open No. 2015-207393).

The voltage detection structure and busbar module described above are desired to be simplified because of fuses each interposed between the corresponding busbar and voltage detection conductor, the fuses each functioning to block an overcurrent that occurs when a voltage larger than the rated voltage is generated by the corresponding battery cell.

SUMMARY OF THE INVENTION

The present invention has been made for the purpose of the above simplification, and is directed to providing a voltage detection structure and a voltage detection module that can have simplified structures while being capable of blocking an overcurrent flowing between a connection conductor and a corresponding voltage detection conductor.

In order to achieve the above mentioned object, a voltage detection structure according to one aspect of the present invention includes a connection conductor electrically connected to one electrode terminal among both electrode terminals of a battery cell; a voltage detection conductor electrically connected to the one electrode terminal; a relay terminal provided to an extremity of the voltage detection conductor and configured to electrically connect together the voltage detection conductor and the connection conductor; and a molding-resin member internally containing a part of the relay terminal and a part of the connection conductor and configured to restrict movement of the relay terminal relative to the connection conductor, wherein the relay terminal includes a fusible part and is electrically connected directly to the connection conductor, the fusible part being operable to fuse and break when an overcurrent flows through the fusible part, and a sectional area of the fusible part perpendicular to a direction in which the voltage detection conductor extends is smaller than a sectional area of any other part of the relay terminal perpendicular to the direction.

According to another aspect of the present invention, in the voltage detection structure, it is possible to configure that the fusible part is an extremity of the relay terminal and is electrically connected directly to the connection conductor.

According to still another aspect of the present invention, in the voltage detection structure, it is possible to configure that the molding-resin member internally contains the fusible part.

In order to achieve the above mentioned object, a voltage detection module according to still another aspect of the present invention includes a plurality of connection conductors each electrically connected to at least one electrode terminal among both electrode terminals of a plurality of battery cells on a same side of the battery cells; a plurality of voltage detection conductors corresponding to the respective connection conductors and electrically connected to the one electrode terminal; a plurality of relay terminals provided to respective extremities of the voltage detection conductors and configured to electrically connect together each of the voltage detection conductors and the corresponding connection conductor; and a plurality of housing cases internally containing parts of the respective relay terminals and parts of the corresponding connection conductors and configured to house the corresponding connection conductors while restricting movement of each of the relay terminals relative to the corresponding connection conductor, wherein each of the relay terminals includes a fusible part and is electrically connected directly to the corresponding connection conductor, the fusible part being operable to fuse and break when an overcurrent flows through the fusible part, and a sectional area of the fusible part perpendicular to a direction in which the corresponding voltage detection conductor extends is smaller than a sectional area of any other part of the relay terminal perpendicular to the direction.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

The following describes embodiments of a voltage detection structure and a voltage detection module according to the present invention in detail based on the drawings. These embodiments are not intended to limit this invention. Components included in the following embodiments may include a component that the skilled person can easily conceive, and may include components substantially the same as each other. Any component included in the following embodiments may be omitted, substituted, or modified without departing from the spirit of the present invention.

First Embodiment

Figure 1:
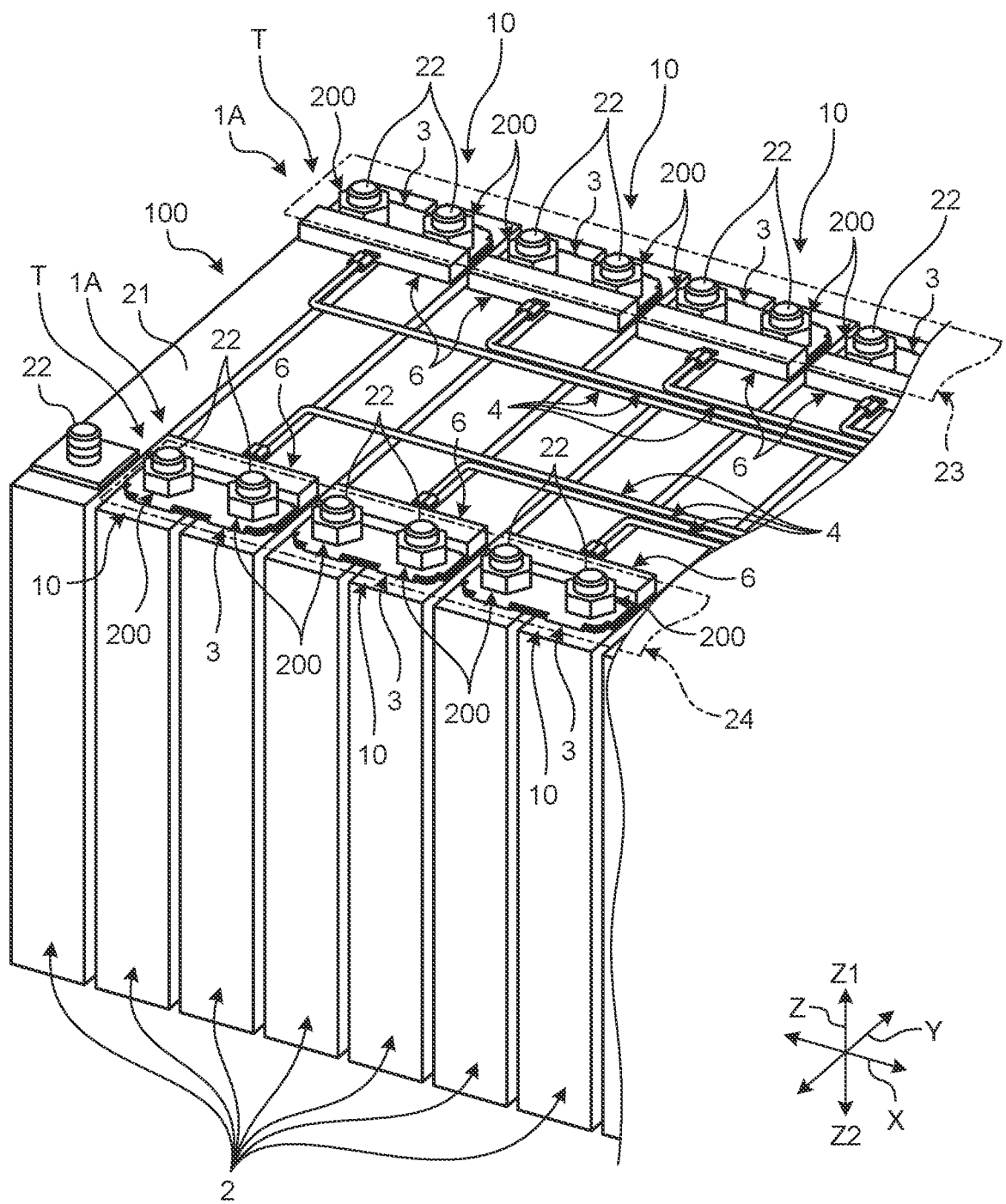
FIG. 1 is a perspective view of a voltage detection structure and a voltage detection module according to a first embodiment.
Figure 2:
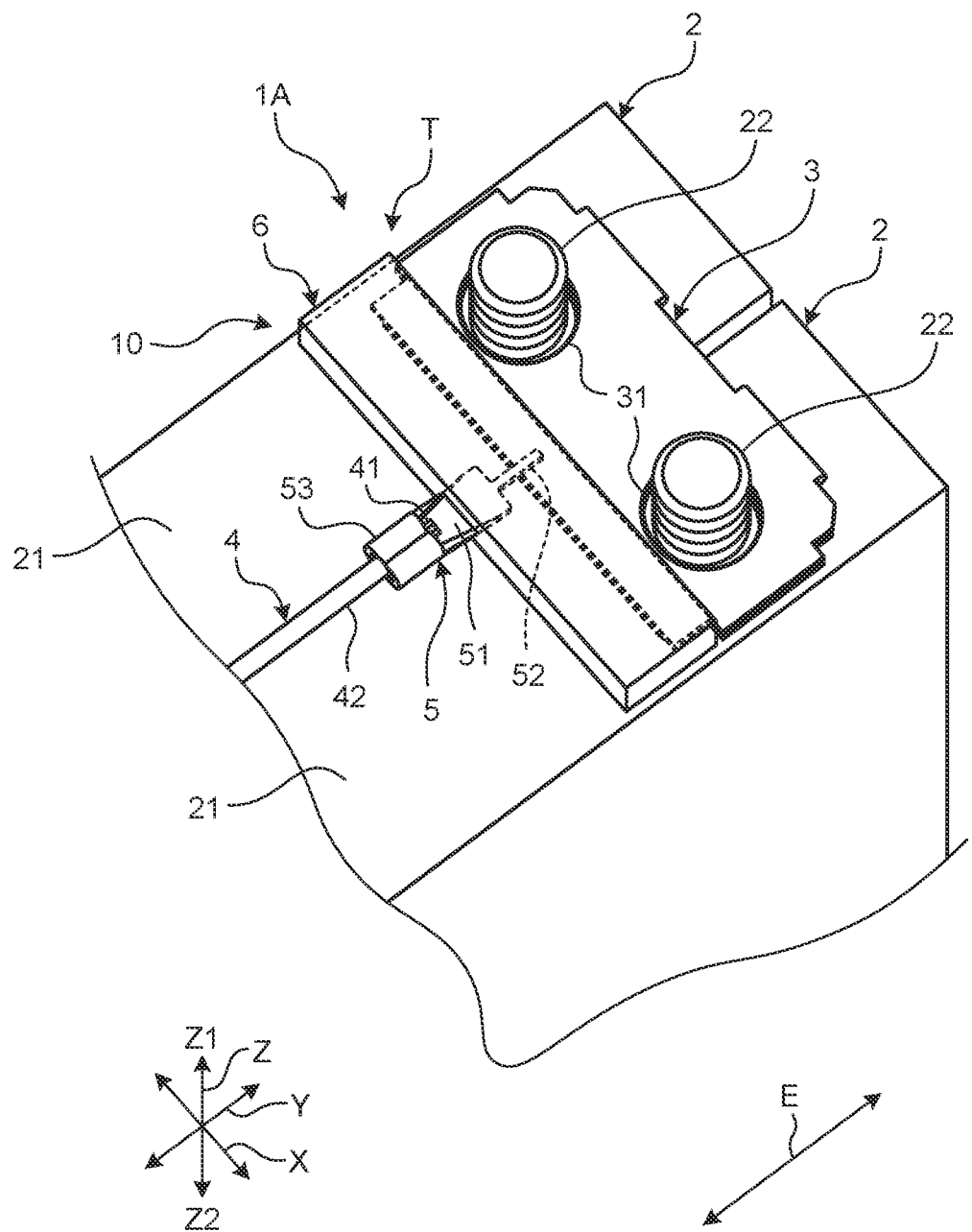
FIG. 2 is a perspective view of the voltage detection structure according to the first embodiment.
Figure 3:
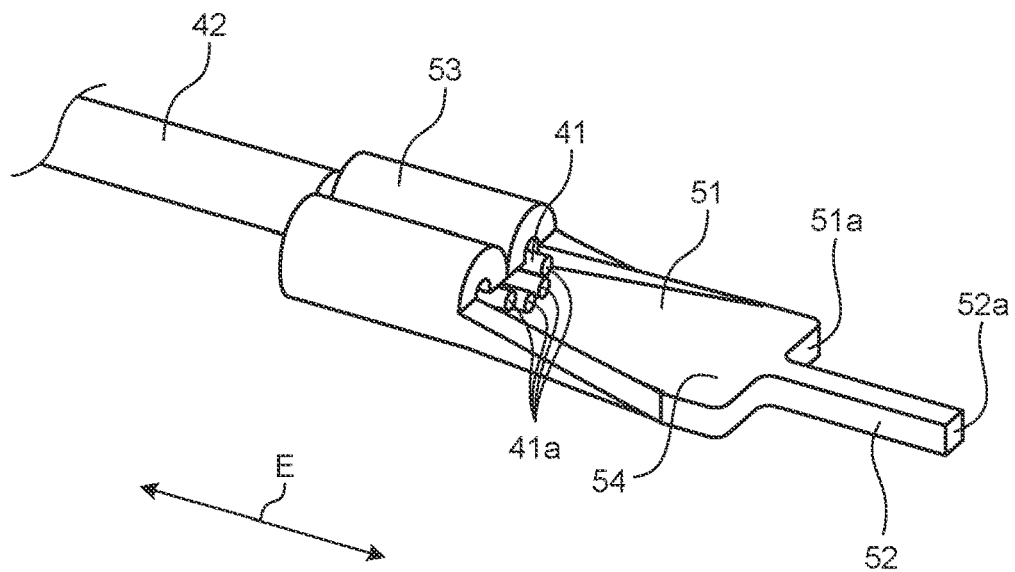
FIG. 3 is an enlarged view of the voltage detection structure according to the first embodiment.
Figure 4:
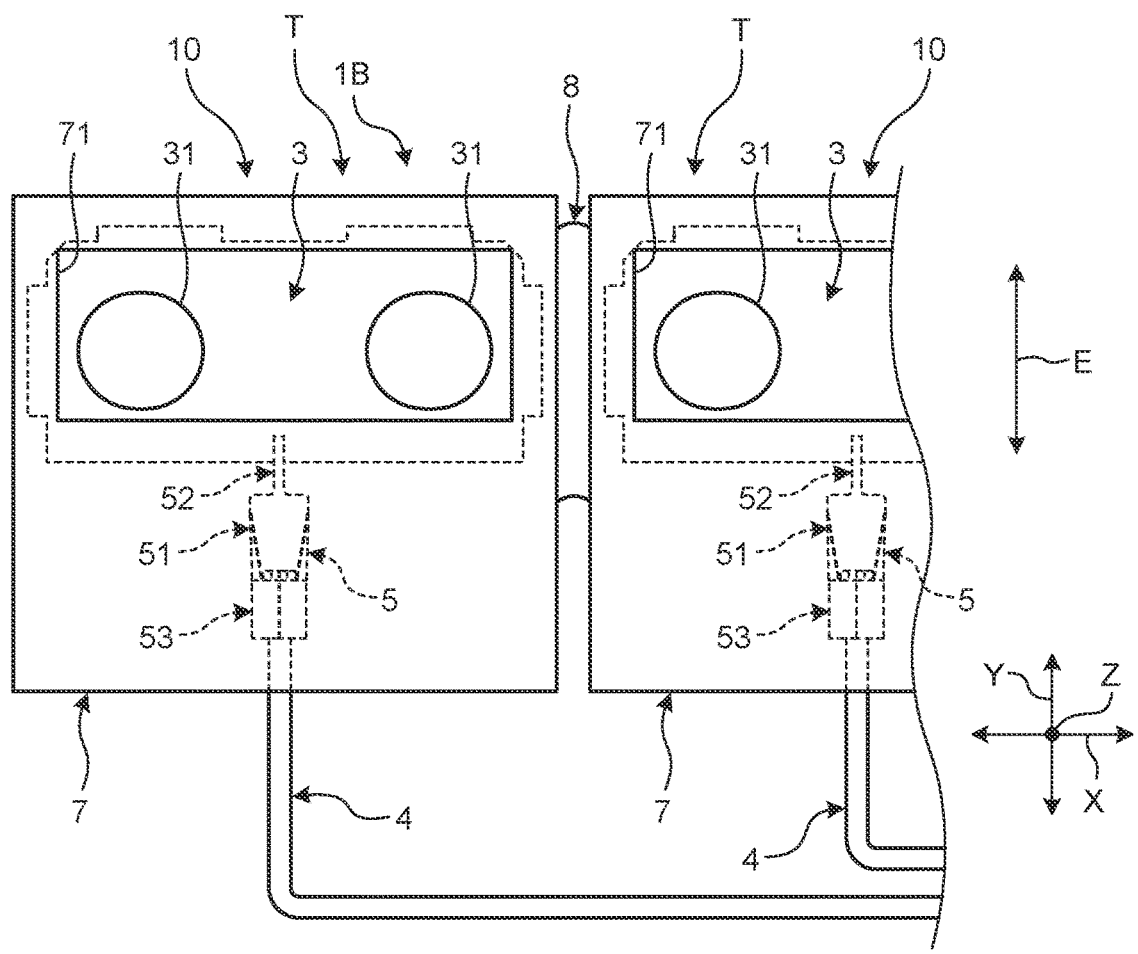
FIG. 4 is a front view of a voltage detection structure according to a second embodiment.

A voltage detection structure and a voltage detection module according to an embodiment are described first. FIG. 1 is a perspective view of a voltage detection structure and a voltage detection module according to a first embodiment. FIG. 2 is a perspective view of the voltage detection structure according to the first embodiment. FIG. 3 is an enlarged view of the voltage detection structure according to the first embodiment. Among these drawings, FIG. 3 illustrates a voltage detection conductor and a relay terminal in the voltage detection structure according to the first embodiment. The X direction in FIGS. 1, 2, and 4 is the width direction of each battery cell, that is, a direction along the short sides thereof. The Y direction is the depth direction of the battery cell, that is, a direction along the long sides thereof. The Y direction is also a direction perpendicular to the X direction. The Z direction is the height direction of the battery cell, that is, the vertical direction. The Z direction is also a direction perpendicular to the X and Y directions. The Z1 direction is the vertically upward direction, and the Z2 direction is the vertically downward direction. The E direction in FIGS. 2 to 4 is the direction of extension of the voltage detection conductor.

A battery pack 100 that powers various on-vehicle electric parts such as a junction box and an inverter is installed in an electric vehicle or a hybrid vehicle. As illustrated in FIG. 1, the battery pack 100 includes a voltage detection module 1A, a plurality of battery cells 2, and a monitoring unit (not illustrated). The battery pack 100 is constructed by having each of the battery cells 2 and the monitoring unit electrically connected together via the voltage detection module 1A. The monitoring unit in this case monitors the power storage states of the battery cells 2 based on voltage information on the battery cells 2, and includes voltage detectors. Voltage detection conductors 4 to be described later are electrically connected to the voltage detectors, so that the voltage detectors are electrically connected to the respective battery cells 2. The battery pack 100 is installed in an engine room of a vehicle with the voltage detection module 1A, the battery cells 2, and the monitoring unit contained in one housing.

As illustrated in FIG. 1, the voltage detection module 1A enables the battery cells 2 to be electrically connected in series to one another and enables the respective battery cells 2 to be electrically connected to the voltage detectors. That is, the voltage detection module 1A partly functions as a busbar module. The voltage detection module 1A includes a plurality of voltage detection units 10 each composed of a busbar 3, a voltage detection conductor 4, a relay terminal 5, and a molding-resin member 6.

The battery cells 2 herein function as a battery that stores electric power therein. As illustrated in FIG. 1, the battery cell 2 has a cell body shaped like a rectangular parallelepiped, and each cell body is individually housed in an insulative resin housing or the like (not illustrated). The battery cell 2 has two electrode terminals 22 on opposite end portions of an electrode-terminal projecting face 21 in the direction along the long sides of the battery cell 2, the electrode-terminal projecting face 21 being one of the six faces forming the cell body. One and the other of the two electrode terminals 22 serve as positive and negative electrode terminals 22, respectively. The battery cells 2 are continuously arranged so that the electrode terminals 22 on each side of the battery cells 2 can be arranged in a row in a direction along the short sides of the battery cells 2. The battery cells 2 form a first electrode terminal group 23 composed of the electrode terminals 22 on one side thereof that are arranged in a row in a direction of arrangement of the battery cells 2 and a second electrode terminal group 24 composed of the electrode terminals 22 on the other side thereof that are arranged in a row in a direction of the arrangement. So as to be electrically connected together in series, the battery cells 2 in this embodiment are arranged in a row with the positive and negative electrode terminals 22 alternately arranged in each of the electrode terminal groups 23 and 24. In this embodiment, the battery cell 2 includes, as the electrode terminals 22, two stud bolts provided upright on two opposite end portions of the electrode-terminal projecting face 21 in the direction along the long sides thereof. The battery cells 2 are installed in a vehicle with the electrode-terminal projecting face 21 placed so as to face vertically upward.

Each of the busbars 3 is a connection conductor 3 and is electrically connected to one of the two electrode terminals 22 of each of the corresponding battery cells 2. Each of the busbars 3 electrically connects adjacent two electrode terminals 22 together in each of the electrode terminal groups 23 and 24. The busbars 3 are arranged in rows, each including two or more busbars 3, in the direction of arrangement of the battery cells 2. The busbar 3 is, for example, formed of electroconductive metal such as pure copper and in a flat plate-like shape. The busbar 3 is formed so as to be rectangular as viewed vertically from above or below. Two through-holes 31 through each of which one of the electrode terminals 22 passes are formed in one face of the busbar 3, the one face being rectangular as viewed vertically from above or below. The two through-holes 31 are arranged side by side in a direction along the short sides of the battery cells 2, that is, a direction along the long sides of the busbar 3, and each have a diameter through which one of the electrode terminals 22 can pass. The busbar 3 is electrically connected to the corresponding electrode terminals 22 by welding or screwing. In the case of the busbars 3 in this embodiment, the electrode terminals 22 are stud bolts, and, after having the through-holes 31 penetrated by the stud bolts, nuts 200 serving as fastening members are fitted around the respective electrode terminals 22 and then clamped, so that each of the busbars 3 and each of the corresponding electrode terminals 22 are securely fastened together and electrically connected.

As illustrated in FIGS. 1 to 3, the voltage detection conductor 4 conducts a current generated by the corresponding battery cell 2 to the corresponding voltage detector. The voltage detection conductor 4 has one end portion thereof electrically connected to one of the busbars 3 and the other end portion thereof electrically connected to the voltage detector. The voltage detection conductors 4 are electrically connected to the respective busbars 3. The voltage detection conductors 4 are electrically connected to the respective busbars 3, thereby being electrically connected to the electrode terminals 22 via the busbars 3. As illustrated in FIG. 3, the voltage detection conductor 4 is formed of a linear conductor 41 and a covering member 42 that covers the outer circumference of the conductor 41. In the both end portions of the voltage detection conductor 4, the conductor 41 is exposed to the outside of the covering member 42. The conductor 41 is formed of a plurality of bundled conducting wires 41a made of electroconductive metal such as copper. The covering member 42 covers the outer circumference of the conductor 41 in the direction of extension of the voltage detection conductor 4, that is, the direction of extension of the conductor 41. The covering member 42 is formed of insulative material such as resin, and has sufficient flexibility such that it can undergo a bending process.

The relay terminal 5 electrically connects the voltage detection conductor 4 and the busbar together, and is electrically connected directly to the busbar 3. The relay terminal 5 is provided at one extremity of the voltage detection conductor 4. The relay terminal 5 is, for example, formed of electroconductive metal such as copper alloy and in a flat plate-like shape. Examples of copper alloy include brass. In order to block an overcurrent with a fusible part 52 to be described fusing, the relay terminal 5 is formed of metal having lower conductivity than the busbar 3. In order to block an overcurrent with the fusible part 52 fusing, the relay terminal 5 has a smaller thickness than the busbar 3. That is, the metal forming the relay terminals 5 has a characteristic and a thickness that are different from those of the metal forming the busbars 3. The relay terminal 5 is formed so as to be rectangular as viewed vertically from above or below. The relay terminal 5 includes a main body part 51, a fusible part 52, and a pressure-bonded part 53.

The main body part 51 conducts, toward the voltage detection conductor 4, a current having been fed from one of the battery cells 2. The main body part 51 is formed so as to be rectangular as viewed vertically from above. The main body part 51 is electrically connected to the conductor 41 of the voltage detection conductor 4 by having an externally exposed part of the conductor 41 in the voltage detection conductor 4 placed on the main body part 51 as viewed vertically from above.

In response to an overcurrent that flows when a voltage generated by the battery cell 2 is not less than the rated voltage value, the fusible part 52 blocks the overcurrent between the busbar 3 and the relay terminal 5, thus functioning as a fuse. The overcurrent herein means a current found to have a value not less than a predetermined rated current value. The fusible part 52 is formed at an end portion 54 of the main body part 51, that is, one of the opposite end portions thereof in the direction of extension of the voltage detection conductor 4, the one not facing the voltage detection conductor 4. At the end portion 54 of the main body part 51, the fusible part 52 projects from an end face perpendicular to the direction of extension of the voltage detection conductor 4, and extends in the direction of extension of the voltage detection conductor 4. That is, the fusible part 52 is an extremity of the relay terminal 5. One end portion of the fusible part 52 in the direction of extension of the voltage detection conductor 4 is fixed to the busbar 3 by welding, soldering, or the like. The fusible part 52 is physically connected directly to the busbar 3, thereby being electrically connected to the busbar 3. The electrical connection of the fusible part 52 to the busbar 3 results in electrical connection of the relay terminal 5 to the busbar 3. A sectional area 52a of the fusible part 52 that is perpendicular to the direction of extension of the voltage detection conductor 4 is formed smaller than a sectional area of any part of the relay terminal 5 other than the fusible part 52. For example, the sectional area 52a is formed smaller than a sectional area 51a of the main body part 51 perpendicular to the direction of extension of the voltage detection conductor 4. The sectional area 52a of the fusible part 52 is formed so that, when an overcurrent flows, the fusible part 52 can fuse and break with heat generated depending on the conductivity of metal forming the relay terminal 5, that is, the electrical resistance of the metal because the current flows through the metal.

The pressure-bonded part 53 serves for fixing the conductor 41 to the main body part 51 and also serves for fixing the voltage detection conductor 4 to the relay terminal 5. The pressure-bonded part 53 is provided at the other one of the opposite end portions of the main body part 51 in the direction of extension of the voltage detection conductor 4. That is, the pressure-bonded part 53 is formed opposed to the fusible part 52 across the main body part 51. The pressure-bonded part 53 is formed at an end portion of the main body part 51 opposite to the end portion 54 thereof so as to, as viewed vertically from above or below, project in two opposite directions that are perpendicular to the direction of extension of the voltage detection conductor 4. With the conductor 41 being placed on the main body part 51, the pressure-bonded part 53 is pressure-bonded, toward the center of the voltage detection conductor 4 along the direction of extension thereof, to the main body part 51 while enveloping the outer circumferential surface of the conductor 41 with the conductor 41 rolled inside. Consequently, the conductor 41 is fixed to the main body part 51. The pressure-bonded part 53 projects vertically above the main body part 51. Consequently, the conductor 41 and the pressure-bonded part 53 are electrically connected together, that is, the relay terminal 5 and the voltage detection conductor 4 are electrically connected together.

The molding-resin member 6 serves for restricting movement of the relay terminal 5 relative to the busbar 3. The molding-resin member 6 is formed of insulative synthetic resin or the like. The molding-resin member 6 is formed in a substantially rectangular parallelepiped shape having a face that is rectangular as viewed vertically from above. The molding-resin member 6 is formed so that, as viewed vertically from above, one of the long sides of the rectangular face can correspond to one of the long sides of the busbar 3. The molding-resin member 6 internally contains a part of the relay terminal 5 and a part of the busbar 3. The molding-resin member 6 in this embodiment internally contains: the fusible part 52 and a part of the main body part 51, in the relay terminal 5; and an end portion of the busbar 3 along the long side thereof, the end portion including a portion fixed to the fusible part 52. The molding-resin member 6 is formed by injection molding such as insert molding so as to internally contain the above parts. An end face that faces downward vertically of the molding-resin member 6 is formed with the busbar 3 internally contained and so as to be substantially flush with an end face that faces downward vertically of the busbar 3. The molding-resin member 6 is integrated with the busbar 3, the relay terminal 5, and the voltage detection conductor 4.

In the above-described manner, the voltage detection module 1A consequently has each of the busbars 3 and the corresponding relay terminal 5 fixed together and electrically connected directly together by the fusible part 52, has the relay terminal 5 and the corresponding voltage detection conductor 4 electrically connected together, and has the molding-resin member 6 internally containing a part of the relay terminal 5 and a part of the busbar 3. As a result, voltage detection structures T that detect voltages from the battery cells 2 are formed.

Next, an example of the procedure for hooking up the battery cells 2 to the voltage detection module 1A is described with reference to FIGS. 1 to 3. First, a worker removes the covering member 42 in one end portion of the voltage detection conductor 4, places a thus externally exposed part of the conductor 41 on the main body part 51 of the relay terminal 5, and bonds the voltage detection conductor 4 to the relay terminal 5 by pressure with the pressure-bonded part 53. The worker then fixes the extremity of the fusible part 52 to the busbar 3. The worker then sets a part of the relay terminal 5 and a part of the busbar 3 in a mold of an injection molder, and performs insert molding. Consequently, the parts of the relay terminal 5 and the busbar 3 are internally contained in the molding-resin member 6. In the above-described manner, the busbar 3, the voltage detection conductor 4, the relay terminal 5, and the molding-resin member 6 are integrated with one another, so that the voltage detection structure T is formed. That is, the voltage detection unit 10 is formed.

The worker then inserts the electrode terminals 22 of the corresponding battery cells 2 through the through-holes 31 of the busbar 3. The electrode terminals 22 are inserted therethrough while one face having the conductor 41 placed thereon of the relay terminal 5 is positioned facing vertically upward. The worker inserts the electrode terminals 22 through the busbar 3 while moving the busbars 3 vertically downward. When the busbar 3 comes to a point that it can no longer be moved vertically downward for further insertion of the electrode terminals 22 therethrough with the vertically downward-facing end face of the corresponding molding-resin member 6 making contact with the corresponding electrode-terminal projecting faces 21, the worker inserts the respective electrode terminals 22 through the nuts 200 and tightens up the nuts 200. When the worker completes tightening up the nuts 200 against the respective electrode terminals 22, the busbar 3 is fixed to the electrode terminals 22 by being clamped vertically between the nuts 200 and electrode-terminal projecting faces 21. This completes hooking up the battery cells 2 to the voltage detection unit 10. The worker further hooks up each of the voltage detection units 10 with respect to each of the corresponding electrode terminals 22, so that the voltage detection module 1A is formed and that the battery cells 2 are hooked up to the voltage detection module 1A.

The worker electrically connects the other end portion of each of the voltage detection conductors 4 to the voltage detector of the monitoring unit, so that the battery cells 2, the voltage detection module 1A, and the monitoring unit are electrically connected together.

Next, consequences of the flow of an overcurrent between the busbar 3 and the relay terminal 5 are described. First, through the voltage detection structures T, respective voltages from the battery cells 2 are transmitted, in the form of currents from the electrode terminals 22 thereof, to the busbars 3 that are electrically connected to these respective electrode terminals 22. The voltages are then transmitted from these respective busbars 3 to the corresponding voltage detection conductors 4 via the fusible parts 52, that is, the relay terminals 5, thus being transmitted to the corresponding voltage detectors. If any one of the battery cells 2 has generated a voltage not less than a rated voltage value, a current not less than the rated current value flows, as an overcurrent, into the busbar 3 via the electrode terminal 22 thereof. The overcurrent flowing into the busbar 3 then flows into the fusible part 52 from the busbar 3. In response to the flow of the overcurrent through the fusible part 52, heat depending on the conductivity of metal that the fusible part 52 is formed of is generated at the fusible part 52, so that the fusible part 52 fuses and breaks. In the above-described manner, the overcurrent is blocked between the busbar 3 and the voltage detection conductor 4.

As described above, the voltage detection structure T according to the first embodiment includes the relay terminal 5 electrically connected directly to the busbar 3 and having the fusible part 52, the sectional area 52a of which has a diameter smaller than the sectional area of any other part of the relay terminal 5, that fuses and breaks when an overcurrent flows therethrough. This structure T therefore is capable of blocking, between the busbar 3 and the voltage detection conductor 4, an overcurrent that flows when the battery cell 2 has generated a voltage not less than the rated voltage value. The voltage detection structure T is also capable of protecting the monitoring unit and circuits for various other on-vehicle electrical components from overcurrents by blocking any overcurrent between the busbar 3 and the voltage detection conductor 4. Even when any ones of the voltage detection conductors 4 have been brought in contact with each other, for example, by receiving external impacts and have formed a closed circuit with the corresponding battery cells 2, the voltage detection structures T are capable of preventing an overcurrent from flowing through the closed circuit and thereby protecting the battery cells 2 from the overcurrent. In addition, the voltage detection structure T includes the fusible part 52 formed as a part of the relay terminal 5, thereby being allowed to have a simplified structure as compared with, for example, a structure that has a fuse formed as a separate member and placed between the busbar 3 and the corresponding relay terminal 5.

Furthermore, the voltage detection structure T according to the first embodiment includes the relay terminal 5 having the fusible part 52, thereby being allowed to have a reduced number of components for a voltage detection structure as compared with, for example, a structure that has a fuse formed as a separate member and placed between the busbar 3 and the corresponding relay terminal 5. A voltage value detected by the voltage detector as a voltage value of the battery cell 2 reflects internal resistances of components, the difference between the voltage value detected by the voltage detector and the voltage value of the battery cell 2 is larger as the number of components constituting the voltage detection structure is higher. In order to resolve this inconvenience, the voltage detection structure T according to the first embodiment includes the fusible part 52 formed as a part of the relay terminal 5 and thus has a reduced number of components for a voltage detection structure as compared with a structure that needs to include a fuse formed as a separate member, thereby allowing the voltage detector to more accurately detect the voltage value of the battery cell 2. Reduction in number of components can reduce not only the cost for components but also assembly work for the voltage detection structure T, thus resulting in overall cost for the voltage detection structure T.

In the voltage detection structure T according to the first embodiment, the busbar 3 is preferably formed of metal having a low electrical resistivity in order to have relatively low internal resistance, and the relay terminal 5 is preferably formed of metal having a high conductivity and having a thin plate shape because the relay terminal 5 has the fusible part 52. For example, for a structure obtained by having each of the busbars 3 and each of the relay terminals 5 formed of the same metal plate, it is difficult to select metal that has conductivity and thickness appropriate for both of the busbar 3 and the relay terminal 5 in consideration of sheet-metal work that is collectively performed on the busbar 3 and the relay terminal 5. In contrast, the voltage detection structure T according to the first embodiment has the relay terminal 5 and the busbar 3 electrically connected directly together with the relay terminal 5 being fixed to the busbar 3 by welding or soldering, thus enabling selection of kinds of metal that have conductivities and thicknesses appropriate for both of the busbar 3 and the relay terminal 5.

The voltage detection structure T according to the first embodiment has the molding-resin member 6 formed so as to internally contain a part of the relay terminal 5 and a part of the busbar 3, and restricts movement of the relay terminal 5 relative to the busbar 3. Thus, the voltage detection structure T is capable of preventing physical detachment and consequent electrical disconnection of the busbar 3 and the relay terminal 5 from each other, for example, due to external force during assembly or maintenance work, and is capable of preventing the relay terminal 5 from being displaced relative to the busbar 3. If the molding-resin members 6 are formed with the fusible parts 52 externally exposed, the worker can find which of the voltage detection units 10 in the voltage detection module 1A has the fusible part 52 that has fused and broken when an overcurrent has flowed.

The fusible part 52 in the voltage detection structure T according to the first embodiment is an extremity of the relay terminal 5 and is electrically connected directly to the busbar 3 by welding or soldering. Thus, formation of the fusible part 52 is easier, and fixation thereof to the busbar 3 is also easier than in the case of a structure having the fusible part 52 halfway through the relay terminal 5, for example, in an intermediate portion of the main body part 51.

In the voltage detection structure T according to the first embodiment, the molding-resin member 6 is formed with the fusible part 52 internally contained therein. As described above, the fusible part 52 is electrically connected directly to the busbar 3. The molding-resin member 6 therefore can protect a position at which the busbar 3 and the relay terminal 5 are connected together, can directly protect the fusible part 52, each of which has low rigidity with the sectional area 52a formed small, from a physical load due to external force or the like, and can prevent the relay terminal 5 from moving, that is, being displaced, relative to the busbar 3. In addition, because a load attributable to vibration of the vehicle body when the vehicle runs can be dispersed across the entirety of the molding-resin member 6, a load that acts on the fusible part 52 can be reduced, that is, the position at which the busbar 3 and the relay terminal 5 are connected together can be directly protected from the load.

The voltage detection module 1A configured according to the first embodiment includes the voltage detection structures T according to the first embodiment. The voltage detection module 1A therefore not only can block an overcurrent, between each of the busbars 3 and the corresponding voltage detection conductor 4, that flows when the corresponding battery cell 2 has generated a voltage not less than the rated voltage value, but also can have a simplified structure. Moreover, because the voltage detection units 10 each including the voltage detection structure T are modularized, work efficiency can be enhanced in a manner such that, when any one of the fusible parts 52 has fused and broken, only the voltage detection module 1A is replaced.

The voltage detection structure T according to the first embodiment is configured to enable the voltage detection units 10 to be attached directly to the battery cells 2. Alternatively, the voltage detection units 10 may be housed in insulating housing cases formed of synthetic resin or the like, and the housing cases may be attached to the battery cells 2.

Second Embodiment

A voltage detection structure and a voltage detection module according a second embodiment are described next. FIG. 4 is a front view of a voltage detection structure according to the second embodiment. The difference of the voltage detection structure and the voltage detection module according to the second embodiment from the voltage detection structure and the voltage detection module according to the first embodiment is the shape of the molding-resin member 6. Duplicated descriptions of configurations, operations, and effects that are the same as those of the first embodiment described above are omitted as far as possible.

As illustrated in FIG. 4, the voltage detection module 1B includes housing cases 7 internally containing parts of the relay terminals 5 and parts of the busbars 3, thereby restricting movement of the relay terminals 5 relative to the busbars 3. The respective housing cases 7 house the busbars 3 in internally formed housing spaces thereof. That is, the molding-resin members 6 in the first embodiment correspond to the housing cases 7 in the second embodiment. Each of the housing cases 7 has a rectangular opening 71 through which the internal housing space and the external space communicate with each other. The opening 71 is formed in a size that allows the through-holes 31 of the busbar 3, that is, the electrode terminals 22, to be exposed to the outside of the housing case 7.

In the voltage detection module 1B, each adjacent two of the housing cases 7 are coupled together by a hinge 8. The hinge 8 has a certain level of movability. For example, when any one of the housing cases 7 had expanded with heat generated when a current flows through the voltage detection module 1B, a difference in external size of the housing case 7 due to the expansion can be absorbed because the hinge 8 has the movability.

As described above, the voltage detection module 1B according to the second embodiment includes the housing cases 7 internally containing parts of the relay terminals 5 and the busbars 3 and restricts movement of the relay terminals 5 relative to the busbars 3, thereby being allowed to have a simplified structure as compared with a case having each of the molding-resin members 6 and the corresponding housing case 7 formed as members separate from each other.

Each of the voltage detection modules 1A and 1B in the present embodiments is configured to electrically connect the battery cells 2 together in series but is not limited to this configuration, and may be configured to electrically connect the battery cells 2 together in parallel. In such a case, the battery cells 2 are arranged in a row with the positive electrode terminals 22 arranged in a row and the negative electrode terminals 22 arranged in a row in the respective electrode terminal groups 23 and 24. For example, each of the voltage detection modules 1A and 1B may have the positive electrode terminals arranged in a row in the first electrode terminal group 23 and have the negative electrode terminals 22 arranged in a row in the second electrode terminal group 24.

The fusible parts 52 in the present embodiments are configured to be extremities of the relay terminals 5 but are not limited to this configuration. For example, each of the fusible parts 52 may be provided in any portion of the corresponding relay terminal 5, such as an intermediate portion of the main body part 51 thereof in the direction of extension of the corresponding voltage detection conductor 4.

The voltage detection module 1A in the present embodiments includes the voltage detection conductors 4 being run each including the conductor 41 formed of the bundled conducting wires 41a, that is, each being formed as what is called an electric cable, but is not limited to this configuration. For example, the voltage detection module 1A may include the voltage detection conductors 4 each formed as a flexible flat cable (FFC).

The busbars 3 in the present embodiments are configured to be connection conductors and be electrically connected directly to the electrode terminals 22, but are not limited to this configuration. For example, busbars may be electrically connected directly to the electrode terminals 22, and the connection conductors 3 may be placed on the respective busbars for example so that each of the busbars and the corresponding connection conductor 3 can be electrically connected together.

The voltage detection structure and the voltage detection module have a relay terminal having a fusible part, the area of a section of which perpendicular to a direction in which the voltage detection conductor extends is smaller than the area of any other part of the relay terminal perpendicular to the direction, thereby being capable of blocking an overcurrent flowing between the connection conductor and the corresponding voltage detection conductor. The voltage detection structure and the voltage detection conductor can have simplified structures because the relay terminal can be electrically connected directly to the connection conductor.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A voltage detection structure comprising:
   a connection conductor electrically connected to one electrode terminal among both electrode terminals of a battery cell;
   a voltage detection conductor electrically connected to the one electrode terminal;
   a relay terminal provided to an extremity of the voltage detection conductor and configured to electrically connect together the voltage detection conductor and the connection conductor; and
   a molding-resin member internally containing a part of the relay terminal and a part of the connection conductor and configured to restrict movement of the relay terminal relative to the connection conductor, wherein
   the relay terminal includes a fusible part and is electrically connected directly to the connection conductor, the fusible part being operable to fuse and break when an overcurrent flows through the fusible part, and
   a sectional area of the fusible part perpendicular to a direction in which the voltage detection conductor extends is smaller than a sectional area of any other part of the relay terminal perpendicular to the direction.

2. The voltage detection structure according to claim 1, wherein
   the fusible part is an extremity of the relay terminal and is electrically connected directly to the connection conductor.

3. The voltage detection structure according to claim 1, wherein
   the molding-resin member internally contains the fusible part.

4. The voltage detection structure according to claim 2, wherein
   the molding-resin member internally contains the fusible part.

5. A voltage detection module comprising:
   a plurality of connection conductors each electrically connected to at least one electrode terminal among both electrode terminals of a plurality of battery cells on a same side of the battery cells;
   a plurality of voltage detection conductors corresponding to the respective connection conductors and electrically connected to the one electrode terminal;
   a plurality of relay terminals provided to respective extremities of the voltage detection conductors and configured to electrically connect together each of the voltage detection conductors and the corresponding connection conductor; and
   a plurality of housing cases internally containing parts of the respective relay terminals and parts of the corresponding connection conductors and configured to house the corresponding connection conductors while restricting movement of each of the relay terminals relative to the corresponding connection conductor, wherein
   each of the relay terminals includes a fusible part and is electrically connected directly to the corresponding connection conductor, the fusible part being operable to fuse and break when an overcurrent flows through the fusible part, and
   a sectional area of the fusible part perpendicular to a direction in which the corresponding voltage detection conductor extends is smaller than a sectional area of any other part of the relay terminal perpendicular to the direction.

* * * * *